United States Patent [19]

Siwko

[11] 3,708,620

[45] Jan. 2, 1973

[54] BANDPASS AMPLIFIER

[75] Inventor: Karol Siwko, Batavia, N.Y.

[73] Assignee: GTE Sylvania Incorporated

[22] Filed: Dec. 7, 1970

[21] Appl. No.: 95,484

[52] U.S. Cl...................178/7.3 R, 333/70, 325/477, 325/489

[51] Int. Cl...............................................H04n 5/14

[58] Field of Search....178/7.3, DIG. 19, 5.8; 333/73, 333/76, 77, 70; 325/317, 477, 489

[56] References Cited

UNITED STATES PATENTS

| | | | |
|---|---|---|---|
| 3,396,341 | 8/1968 | Von Fange | 333/77 |
| 3,519,737 | 7/1970 | Marsh | 178/5.8 |
| 3,029,400 | 4/1962 | Nelson | 333/77 |
| 3,114,889 | 12/1966 | Avins | 333/77 |

*Primary Examiner*—Richard Murray
*Attorney*—Norman J. O'Malley, Robert E. Walrath and Thomas H. Buffton

[57] ABSTRACT

A bandpass amplifier having a double tuned resonant circuit is shown. The double tuned circuit has a parallel resonant circuit connected in series with a series resonant circuit which provides at least one additional resonant frequency utilized to provide additional selectivity.

5 Claims, 4 Drawing Figures

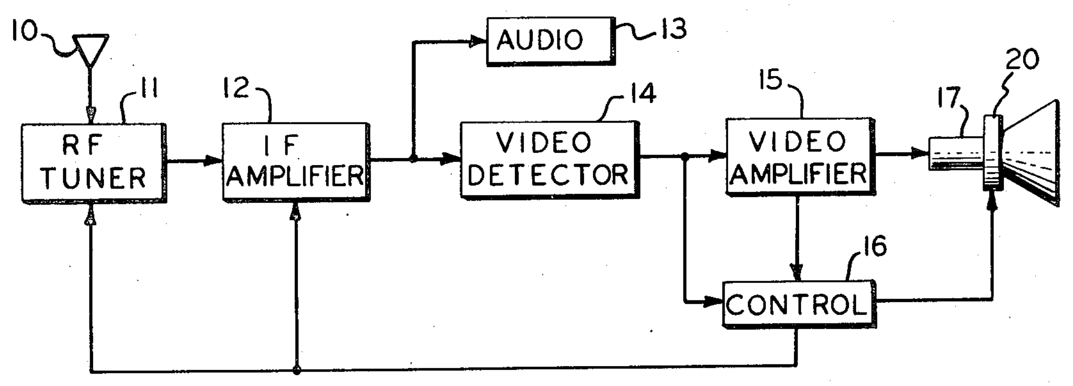
Fig. 1
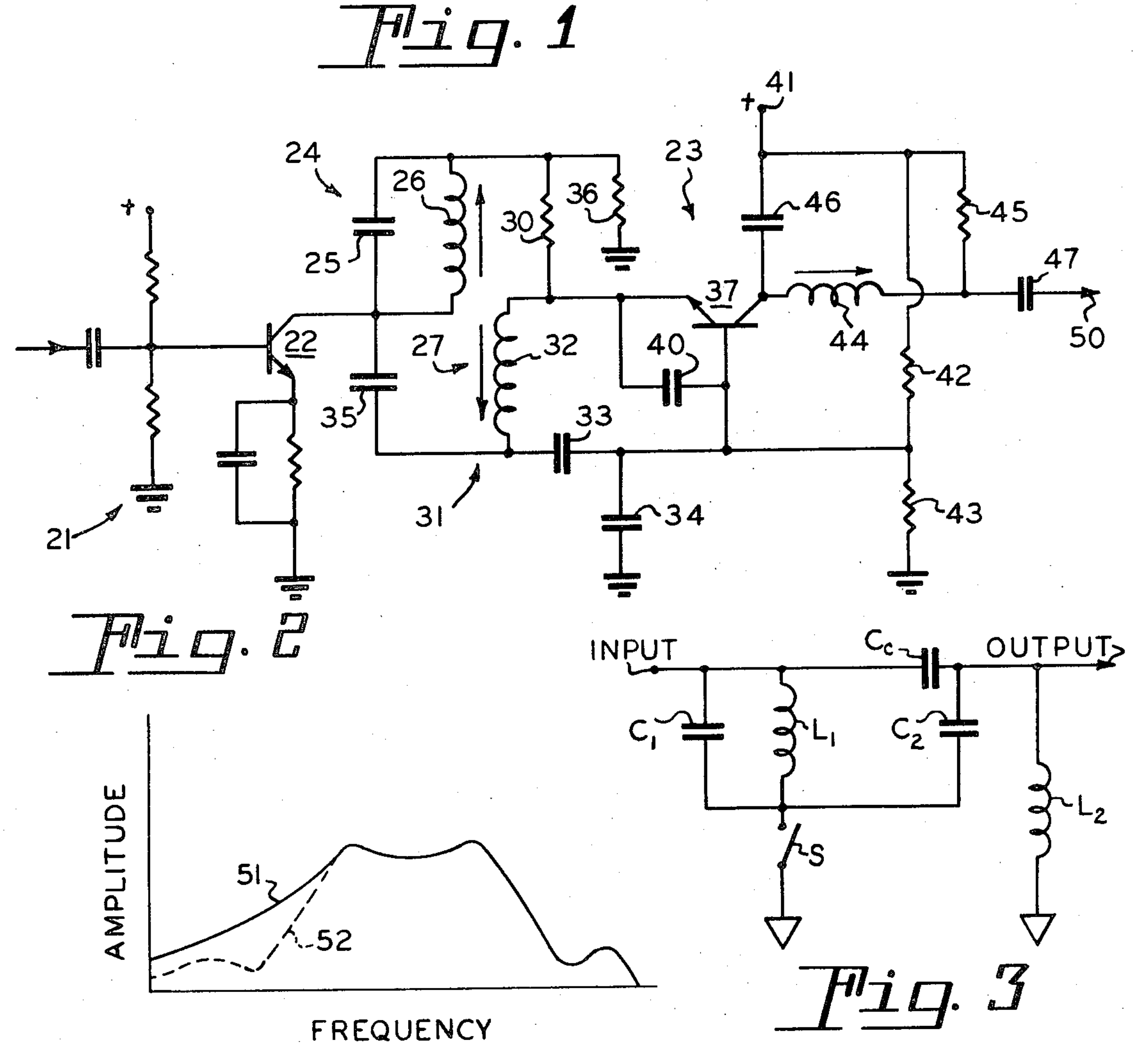
Fig. 2 Fig. 3
Fig 4
INVENTOR.
KAROL SIWKO
BY Robert E. Walrath
ATTORNEY

BANDPASS AMPLIFIER

CROSS-REFERENCE TO RELATED APPLICATION

A copending application of Karol Siwko, Ser. No. 95,485 filed on the same date as this application and assigned to the same assignee as this application, discloses an intermediate frequency amplifier that utilizes the structure disclosed in this application.

BACKGROUND OF THE INVENTION

Intermediate frequency (IF) amplifiers, such as those used in television receivers, are designed to provide a particular passband frequency response with rejection of all signals outside the passband. The selectivity, i.e., that characteristic of an IF amplifier that determines the extent to which the amplifier is capable of distinguishing between the desired signal and signals of other frequencies, of a typical IF amplifier can be increased by using additional tuned amplifier stages or higher Q circuits. In typical prior art television receivers a double tuned bandpass amplifier is used as one stage of the IF amplifier to provide greater selectivity than would otherwise be provided by a single amplifier stage. Typically, the bandpass amplifier stage has two resonant frequencies which define the passband of the stage. Further stages or higher Q circuits are necessary for additional improvement in selectivity. Such additional stages or higher Q circuits increase the cost or complexity of the amplifier or both.

OBJECTS AND SUMMARY OF THE INVENTION

Accordingly, it is an object of this invention to improve the selectivity of a bandpass amplifier.

It is a further object of this invention to improve the selectivity of an intermediate frequency amplifier with a bandpass amplifier stage.

In one aspect of this invention, the above objects and advantages are achieved in a bandpass amplifier including a double tuned resonant circuit with first and second resonant frequencies and parallel and series resonant portions. The bandpass amplifier includes means connecting the parallel resonant portion and the series resonant portion in series with a source of signals. An input means of an amplifying device is connected to the resonant circuit for providing a bandpass frequency response between the first and second resonant frequencies, and a third resonant frequency is provided for rejection of signals outside the passband.

In another aspect of this invention, the above objects and advantages are achieved in a television receiver having an intermediate frequency amplifier with a bandpass amplifier stage. The bandpass amplifier stage includes means connecting a parallel resonant circuit in series with a series resonant circuit and further in series with a signal source. The tuned circuit has first and second resonant frequencies defining the passband of the passband amplifier stage and a third resonant frequency out of the passband for parallel resonant signals out of the passband. An input means of an amplifying device is connected to the tuned circuit.

BRIEF DESCRIPTION OF THE DRAWINGS

FIG. 1 is a block diagram of a television receiver in which the invention can be utilized;

FIG. 2 is a schematic diagram of one embodiment of the invention;

FIG. 3 is a simplified schematic diagram of an alternative embodiment of the invention; and FIG. 4 is a graph of a bandpass frequency response to aid in explaining the invention.

DESCRIPTION OF THE PREFERRED EMBODIMENT

For a better understanding of the present invention, together with other and further objects, advantages and capabilities thereof, reference is made to the following disclosure and appended claims in connection with the above-described drawings.

In the television receiver of FIG. 1 an antenna 10 is connected to a signal input of a radio frequency (RF) tuner 11 which has an output connected to an input of an intermediate frequency (IF) amplifier 12. IF amplifier 12 provides outputs to an audio channel 13 and a video detector 14. Video detector 14 provides outputs to video amplifier 15 and control circuitry 16. Video amplifier 15 provides an output to control circuitry 16 and to a cathode ray tube (CRT) 17. Control circuitry 16 includes the usual automatic gain control circuitry which provides gain control signals to RF tuner 11 and IF amplifier 12. Control circuitry 16 also includes synchronizing and deflection circuitry which provides deflection signals to a yoke 20 positioned on CRT 17. IF amplifier 12 preferably includes a plurality of stages one of which is a bandpass amplifier stage in accordance with the embodiment of the invention illustrated in FIG. 2.

In FIG. 2 an amplifier stage 21 including a transistor 22 amplifies the IF signal which appears at a collector of transistor 22. Amplifier stage 21 can be a common base transistor amplifier with gain control as is illustrated in the above-referenced copending application. The collector of transistor 22 comprises a signal source for a bandpass amplifier such as bandpass amplifier stage 23. The collector of transistor 22 is connected to a parallel resonant circuit 24 that includes a capacitor 25 connected in parallel with an inductor, such as a tunable winding 26 on a transformer 27. The opposite end of resonant circuit 24 is connected by a resistor 30 to a series resonant circuit 31 that includes an inductor, such as a tunable winding 32 on transformer 27, connected in series with a capacitor 33. Windings 26 and 32 are coupled by a mutual inductance so that the circuit is a double tuned resonant circuit with a parallel resonant portion 24 connected in series with a series resonant portion 31.

Capacitor 33 of series resonant circuit 31 is connected to ac ground such as a coupling capacitor 34 connected to a common conductor illustrated as ground. The collector of transistor 22 is connected by a coupling capacitor 35 to the junction between winding 32 and capacitor 33 while the junction between winding 26 and resistor 30 is connected by a resistor 36 to ground.

The junction between resistor 30 and winding 32 of series resonant circuit 31 is connected to an input means of an amplifying device such as an emitter of a NPN transistor 37. A base of transistor 37 is connected to capacitor 34 (ac ground). A capacitor 40 is connected between the emitter and base of transistor 37 thereby connecting it in parallel with the input means of the amplifying device. A source of bias potential, illustrated as a terminal 41, is connected by a resistor 42 to the base of transistor 37 which is further connected by a resistor 43 to ground. A collector of transistor 37 is connected by a tunable inductor 44 in series with a resistor 45 to source 41 and by a capacitor 46 to source 41. The junction of inductor 44 and resistor 45 is connected by a coupling capacitor 47 to an output terminal 50.

In operation, signals amplified by amplifier stage 21 are applied to bandpass amplifier stage 23 by the collector of transistor 22. Windings 26 and 32 are tunable so that the passband of the amplifier can be tuned as desired. In a double tuned circuit the resonant frequencies can be tuned to the same frequency, i.e., synchronously tuned, or tuned to different frequencies, i.e., stagger tuned. In either case the resonant frequencies define or determine the passband. The double tuned response "appears" across capacitor 40, and hence, across the emitter-base circuit of transistor 37.

In the double tuned circuit of amplifier stage 23, the parallel resonant portion 24 is not separately grounded. Instead the parallel resonant portion 24 is connected in series with the series resonant portion 31 which is connected to ac ground by capacitor 34. At the resonant frequency a parallel resonant circuit has a voltage peak (current minimum), while a series resonant circuit has a current peak (voltage minimum). At frequencies above resonance, the parallel resonant circuit becomes capacitive while the series resonant circuit becomes inductive. At frequencies below resonance the parallel resonant circuit becomes inductive while the series resonant circuit becomes capacitive. Thus, additional resonant frequencies will appear in the double tuned circuit of FIG. 2 above and below the normal resonant frequencies, that is, out of the passband.

In one practical embodiment of this invention, a passband amplifier stage in accordance with the invention, was included in an IF amplifier of a television receiver. The double tuned circuit was tuned to have resonant frequencies at about 46 to 46.5 mHz and at about 41 to 42 mHz. The resonant frequency caused by the inductance of the parallel resonant portion 24 and the capacitance of the series resonant portion 31 at frequencies below resonance was used to provide additional resonant frequency at about 39.75 mHz. Since the IF carrier frequency of the adjacent lower television channel is at 39.75 mHz, the use of the invention provided additional rejection of the lower adjacent channel. In the referred to practical embodiment approximately 15 db improvement in selectivity (rejection of the lower adjacent channel) was obtained without additional stages or components.

In FIG. 3 an alternate and simplified version of the double tuned resonant circuit is shown to further illustrate the invention. An input terminal (equivalent to the collector of transistor 22 of FIG. 2) is coupled to a parallel resonant circuit comprised of a capacitor $C_1$ and an inductor $L_1$ connected in parallel. Capacitor $C_1$ and inductor $L_1$ are further connected in series with a series resonant circuit comprised of a capacitor $C_2$ and an inductor $L_2$ to AC ground. A coupling capacitor $C_c$ (equivalent to coupling capacitor 35 of FIG. 2) is connected from the input terminal to the junction between capacitor $C_2$ and inductor $L_2$ which also comprises an output terminal (equivalent to the emitter of transistor 37 of FIG. 2). A switch S is shown connected between the junction of the parallel and series resonant circuits and ac ground. Switch S is for illustrative purposes only.

In FIG. 4 bandpass response curves are illustrated to aid in explaining the effect of the invention. The solid line curve 51 is the bandpass response when the parallel resonant portion of the double tuned circuit is separately grounded, i.e., switch S of FIG. 3 is closed. Dotted line 52 illustrates the modification of the response when switch S is opened, and an additional resonant frequency is provided by connecting the parallel and series resonant portions in series to provide additional rejection of the lower adjacent channel.

While specific embodiments of the invention have been shown used in a specific application, those skilled in the art will realize that the invention may take many forms. For example, mutual inductive (transformer) coupling is illustrated, but other forms of coupling the parallel and series resonant circuits could be used as well. Also in the specific embodiment the additional resonant frequency below the passband is used to provide increased selectivity (rejection), but those skilled in the art will realize that the additional resonant frequency above the passband can be used also. Those skilled in the art will also realize that the invention is applicable to color television receivers as well as the monochrome receiver illustrated in FIG. 1.

While there has been shown and described what is at present considered the preferred embodiment of the invention, it will be obvious to those skilled in the art that various changes and modifications may be made therein without departing from the scope of the invention as defined by the appended claims.

I claim:

1. A bandpass amplifier including a double tuned resonant circuit with first and second resonant frequencies and parallel and series resonant portions comprising: means connecting said parallel resonant portion in series
   - with said series resonant portion and the series combination in series with said signal source; a capacitor; and
   - an amplifying device having an input means connected in parallel with said capacitor and further in parallel with said series resonant portion for providing a bandpass frequency response between said first and second resonant frequencies with a third resonant frequency for providing rejection of signals outside the passband.

2. In a television receiver having an intermediate frequency amplifier with a bandpass amplifier stage, said bandpass amplifier stage comprising:
   - a tuned circuit including a parallel resonant circuit and a series resonant circuit including first and second tunable windings, respectively, coupled by mutual inductance;
   - a signal source;
   - means connecting said parallel resonant circuit in series with said series resonant circuit and further connecting the series combination in series with said signal source, said tuned circuit having first and second resonant frequencies defining the passband of said bandpass amplifier stage and a third resonant frequency out of said passband for rejecting signals at frequencies lower than the lowest frequency of said first and second resonant frequencies to improve the selectivity of the intermediate frequency amplifier; and an amplifying device having an input means connected to said tuned circuit.

3. A bandpass amplifier as defined in claim 2 wherein said amplifying device is a transistor biased as a common base amplifier and said series resonant circuit is connected between the emitter and base of said transistor.

4. A bandpass amplifier as defined in claim 3 including a capacitor connected in parallel with said series resonant circuit and between the emitter and base of said transistor.

5. A bandpass amplifier as defined in claim 2 wherein said third resonant frequency rejects signals at the intermediate frequency of the carrier of the lower adjacent channel.

* * * * *

PO-1050
(5/69)

UNITED STATES PATENT OFFICE
CERTIFICATE OF CORRECTION

Patent No. 3,708,620 Dated January 2, 1973

Inventor(s) Karol Siwko

It is certified that error appears in the above-identified patent and that said Letters Patent are hereby corrected as shown below:

Per Patent:

Col. 1, line 59 "parallel resonant" should read "rejecting"

Signed and sealed this 22nd day of May 1973.

(SEAL)
Attest:

EDWARD M.FLETCHER,JR.
Attesting Officer

ROBERT GOTTSCHALK
Commissioner of Patents